United States Patent [19]

Epstein et al.

[11] Patent Number: 4,841,099

[45] Date of Patent: Jun. 20, 1989

[54] ELECTRICALLY INSULATING POLYMER MATRIX WITH CONDUCTIVE PATH FORMED IN SITU

[75] Inventors: Arthur J. Epstein, Bexley, Ohio; Joan R. Ewing, Fairport; Joseph A. Swift, Ontario, both of N.Y.

[73] Assignee: Xerox Corporation, Stamford, Conn.

[21] Appl. No.: 188,984

[22] Filed: May 2, 1988

[51] Int. Cl.[4] .......................... H05K 1/00; B23K 31/00
[52] U.S. Cl. ............................... 174/68.5; 219/121.65; 219/121.66; 219/121.85
[58] Field of Search .................. 174/68.5; 219/121.85, 219/121.66, 121.65, 121.78, 121.8

[56] References Cited

U.S. PATENT DOCUMENTS

| | | | |
|---|---|---|---|
| 3,056,881 | 10/1962 | Schwarz | 219/50 |
| 3,406,126 | 10/1968 | Litant | 252/511 |
| 3,414,863 | 12/1968 | Lemelson | 338/244 |
| 3,434,014 | 3/1969 | Taynton | 317/99 |
| 3,614,541 | 10/1971 | Farrand | 317/101 |
| 3,626,143 | 12/1971 | Fry | 219/121.69 |
| 3,627,858 | 12/1971 | Parts et al. | 264/25 |
| 4,159,414 | 6/1979 | Suh et al. | 219/121.17 |
| 4,286,250 | 8/1981 | Sacchetti | 338/306 |
| 4,401,590 | 8/1983 | Yoshimura | 252/514 |
| 4,469,984 | 9/1984 | Sergeen et al. | 313/355 X |
| 4,489,230 | 12/1984 | Yamamoto | 219/121.85 |
| 4,502,098 | 2/1985 | Brown et al. | 361/383 |
| 4,563,078 | 1/1986 | Fantuzzo et al. | 355/3 FU |
| 4,568,632 | 2/1986 | Blum et al. | 430/322 |
| 4,584,456 | 4/1986 | Oodaira et al. | 219/121.83 |
| 4,599,193 | 7/1986 | Murase et al. | 252/511 |
| 4,606,955 | 8/1986 | Eastman et al. | 428/36 |
| 4,675,467 | 6/1987 | Van Dine et al. | 219/121.85 X |
| 4,691,091 | 9/1987 | Lyons et al. | 219/121.85 |

FOREIGN PATENT DOCUMENTS 2647796  4/1978  Fed. Rep. of Germany .

OTHER PUBLICATIONS

Article "Laser Microchemistry and its Application to Electron-Device Fabrication", by R. M. Osgood, in Annual Review Physics Chemistry, 1983, 34 pp. 77 through 101.
IBM Tech. Disclosure Bulletin, vol 9, No. 11, Apr. 1967, p. 1474, "Metal Plating of Pyrolyzste Circuitry".
Reprinted Article "New Transfer Process Applies 3-D Circuitry to Molded Substrates by Andveiev in Elect. Pkg. & Prod.", 12/84.
Article "Mold Your Own?" by Ganjei et al., in Circuits Mfg. 6/86, pp. 39, 40, 42, 45, 47 and 50.

Primary Examiner—Morris H. Nimmo

[57] ABSTRACT

An electrical component is made from an electrically insulating polymer matrix filled with electrically insulating fibrous filler which is capable of heat conversion to electrically conducting fibrous filler and has at least one continuous electrically conductive path formed in the matrix by the in situ heat conversion of the electrically insulating fibrous filler. In a preferred embodiment, the fibrous filler is thermally stabilized polyacrylonitrile fibers and the conductive path is formed by in situ heat converted thermally stabilized polyacrylonitrile fibers which have been converted by directing a laser beam through a mask having a predetermined pattern to melt the polymer and to heat convert the thermally stabilized polyacrylonitrile fibers.

44 Claims, 4 Drawing Sheets

ELECTRICALLY INSULATING POLYMER MATRIX WITH CONDUCTIVE PATH FORMED IN SITU

BACKGROUND OF THE INVENTION

The present invention relates generally to electrical components, methods for making electrical components and machines employing such electrical components. In particular, it relates to multifunctional electrical components with both electrical and mechanical structural functionality and in particular is directed to the use of such components in automatic reproducing machines such as office copiers, duplicators and printers. More specifically, the component comprises an electrically insulating polymer matrix which is filled with an electrically insulating fibrous filler capable of heat conversion to an electrically conducting fibrous filler where at least one continuous electrically conductive path is formed by the in situ heat conversion of the electrically insulating fibrous filler.

In electrostatographic reproducing apparatus commonly used today a photoconductive insulating member is typically charged to a uniform potential and thereafter exposed to a light image of an original document to be reproduced. The exposure discharges the photoconductive insulating surface in exposed or background areas and creates an electrostatic latent image on the member which corresponds to the image contained within the original document. Alternatively, a light beam may be modulated and used to selectively discharge portions of the charged photoconductive surface to record the desired information therein. Typically, such a system employs a laser beam. Subsequently, the electrostatic latent image on the photoconductive insulating surface is made visible by developing the image with developer powder referred to in the art as toner. Most development systems employ developer which comprises both charged carrier particles and charged toner particles which triboelectrically adhere to the carrier particles. During development the toner particles are attracted from the carrier particles by the charged pattern of the image areas of the photoconductive insulating area to form a powder image on the photoconductive area. This toner image may be subsequently transferred to a support surface such as copy paper to which it may be permanently affixed by heating or by the application of pressure.

In commercial applications of such products it is necessary to distribute power and/or logic signals to various sites within the machine. Traditionally, this has taken the form of utilizing conventional wires and wiring harnesses in each machine to distribute power and logic signals to the various functional elements in an automated machine. While the conventional approach has been immensely effective in providing convenience products, with increasing demands on manufacturing cost and the desire for automated assembly, different approaches have to be provided. For example, since individual wires and wiring harnesses are inherently very flexible, they do not lend themselves to automated assembly such as with the use of robotics. Furthermore, such harnesses may have to be handled or moved several times to make all connections required. This is a highly labor intensive exercise frequently requiring routing of the several harnesses through channels around component elements manually with the final connection being also accomplished manually thereby resulting in potential human error in the assembly. The potential for human error is reduced with the use of automated and in particular robotic assembly. However, robots are incapable or inefficient in handling wire harnesses due to the fact that the wires and cables vary in position due to their flexibility. In addition to the relatively high labor costs associated with harness construction and installation electrical wiring harnesses as well as their connectors are less than totally reliable in producing their intended function. Furthermore, and with increasing sophistication of the capabilities of such products, a plurality of wiring harnesses may be required in any individual machine which can require a large volume of space thereby increasing the overall size of the machine. Accordingly, there is a desire to provide an alternative to the conventional wiring and wiring harnesses that overcomes these difficulties.

Several techniques have been proposed to overcome these difficulties including techniques wherein three-dimensional features are molded into a chassis or casing with the potential to build circuitry into the chassis, subchassis or other part. Briefly, the aforementioned techniques can be categorized as utilizing dry processed or wet processes. Examples of dry techniques are the Konec process developed by Union Carbide and the Adap process developed by Allied Signal. Both processes involve a thermal transfer or embossment of either a conductive ink or metallic particles into the injection molded substrate. Another example of a dry process is the film-in-mold decorating technique where the film has a metalized pattern on it and is forced to conform to the interior of the mold and is bonded to the exterior of the molded part. While capable of use for simple circuitry patterns, they are limited in their abilities to produce fully three-dimensional conductive features. The wet processes can be described generally as semi-additive or fully additive with the latter being capable of providing selective metalization of planar and nonplanar three dimensional features on multiple surfaces of complex form. In the semiadditive processes, thermoplastic substrates are chemically pretreated to provide anchoring sites for subsequent catalyst absorption and metallization. Following the surface adhesion promotion treatment, the molded substrate is processes through a catalyst solution followed by electroless plating of a thin copper layer. Thereafter, resist application and image formation followed by copper electroplating and removal of the temporary resist are accomplished.

In addition, there are two fully additive techniques which permit selective plating on three-dimensional surfaces. In the Photoselective Plating process developed by PCK Technology Division of Kollomorgan Corporation, a photo imaginable plating catalyst is used to form three-dimensional images by selectively exposing catalyzed surfaces through a mask to ultraviolet light which initiates a photochemical reaction that converts the catalyst into metallic images corresponding to the desired circuit pattern. Thereafter, copper is applied to the circuit pattern in an electroless bath. The second additive technique is the Mold-n-Plate process also developed by PCK Technology Division wherein two different resin systems are used. One resin contains a plating additive while the second remains plating neutral. This involves a two-shot molding process wherein the first molding is with the resin containing the catalytic plating additive in a mold having the circuit design desired. This is followed by a second injection molding technique with the non-catalytic resin which covers areas of the molded part which are not part of the circuit and permits the circuit design to be exposed on the surface. Thereafter, copper plate is applied to the exposed circuit pattern made up of the resin containing the plating catalyst.

It has also been previously proposed (U.S. Pat. No. 4,286,250) to create electro-conductive pathways in electrically insulating polymers such as polyimides such as Kapton available from E. I. DuPont Company by exposing them to radiation from a laser to pyrolyze the polymer. While capable of providing a electro-conductive pathway, these pathways tend to be extremely delicate and subject to damage upon minimal handling. This is caused by the particulate nature of the conducting region that is only minimally adhered to the pathway resulting from the outgasing accompanying laser pyrolysis which disrupts the mechanical structure of the polymer.

PRIOR ART

U.S. Pat. No. 3,056,881 to Schwarz forms a metal conductive trace in a work piece by exposing the surface to radiant energy such as an electron beam which reduces the normally non-conductive metal oxide such as alumina to pure aluminum which becomes the conductive portion of the device. Either the electron beam can be moved to trace a pattern on the work piece or the work piece itself moved relative to the beam.

U.S. Pat. No. 3,627,858 to Parts et al. describes a method for performing a design on the surface of a thermoplastic article using laser radiation to produce an embossed surface. A mask may be interposed between the laser and the article to project the radiation from the laser in a predetermined pattern on the article.

U.S. Pat. No. 4,159,414 to Suh et al. is directed to forming electrically conductive paths on three dimensional substrates by exposing a polymer composition containing a metal compound preferably a metal oxide to a high intensity laser beam to reduce the metal compound to its elemental state thereby providing an electrically conductive path.

U.S. Pat. No. 4,286,250 to Sacchetti is directed to laser formed resistor elements wherein an insulator substrate has heat applied, for example, by directing a laser beam to a predetermined portion to provide a carburized conductive resistor portion.

U.S. Pat. No. 4,568,632 to Blum et al. is directed to using a mask when laser etching a polyimide substrate.

IBM Technical Disclosure Bulletin Vol. 9, No. 11, April 1967, Page 1474 entitled "Metal Plating of Pyrolyzsate Circuitry", to T. F. Saunders et al. is directed to fabricating printed circuits by the radiant energy pyrolyzation of an organic polymer coating on a substrate sensitized and immersed in an electroless copper plating bath to provide a copper film on the conductive pattern. The film thickness can be increased by electroplating.

West German Pat. No. 2,647,796 to Zink is directed to a circuit board designed as the bottom of a casing which is produced by injection molding thermoplastic material so that the molded section has channels on the side for the printed wiring. The thermoplastic material is then activated and rendered electrically conductive and provided with a coating of a conductive material that forms the wiring paths in an electroplating bath. The process permits a high degree of automation, a three-dimensional profile and the elimination of wiring operations.

SUMMARY OF THE INVENTION

The present invention is directed to an electrical component which comprises an electrically insulating polymer matrix filled with an electrically insulating fibrous filler which is capable of heat conversion to an electrically conductive fibrous filler which includes at least one continuous electrically conductive path formed by the in situ heat conversion of the electrically insulating fibrous filler.

In one aspect of the present invention, the component is a multifunctional component providing both an electrically conductive pathway and a mechanical structural function.

In a further aspect of the present invention, the polymer matrix is present as an adherent surface layer on base support member.

In a further aspect of the present invention, the insulating fibrous fillers are heat convertible carbonaceous fibers which when heat converted from the electrically conductive pathway.

In a specific aspect of the present invention, the heat convertible carbonaceous fibers are thermally stabilized polyacrylonitrile fibers which are heat converted conductive in the electrically conductive pathway.

In a further aspect of the present invention, the component has a plurality of conductive paths formed by the laser pyrolysis of the insulating fibers upon exposure of the polymer matrix through a mask having a predetermined pattern.

In a further aspect of the present invention, the conductive path comprises a narrow groove formed by the laser pyrolysis of a portion of the insulating polymer matrix which melts the polymer and heat converts the electrically insulating fibers to electrically conductive fibers.

In a further aspect of the present invention, the narrow groove forming the electrically conducting pathways has an adherent continuous coating of a conductive metal plated thereon.

In a further aspect of the present the electrical component is three-dimensional in form or shape and has at least one electrically conductive path in a three-dimensional shape.

In a further aspect of the present invention a machine including a plurality of electrical components has at least one support member made from an electrically insulating polymer matrix filled with an electrically insulating fibrous filler which is capable of heat conversion to an electrically conductive fibrous filler and which has at least one continuous electrically conductive path between electrical components formed by the in situ heat conversion of the electrically insulating fibrous filler.

DETAILED DESCRIPTION OF THE INVENTION

In accordance with the present invention, an alternative to the conventional use of wires and wiring harnesses in electrostatographic reproducing apparatus is provided which can eliminate or significantly reduce difficulties associated with such conventional wires and wiring harnesses in the construction of such apparatus and which will enable a significant degree of automated assembly. According to the present invention, an electrically conductive path is formed in a polymer matrix which is filled with electrically insulating fibers that are capable of heat conversion to electrically conducting fibers. The conductive path is obtained by selectively heating the filled polymer matrix to form in situ the electrically conductive path.

Figure 1:
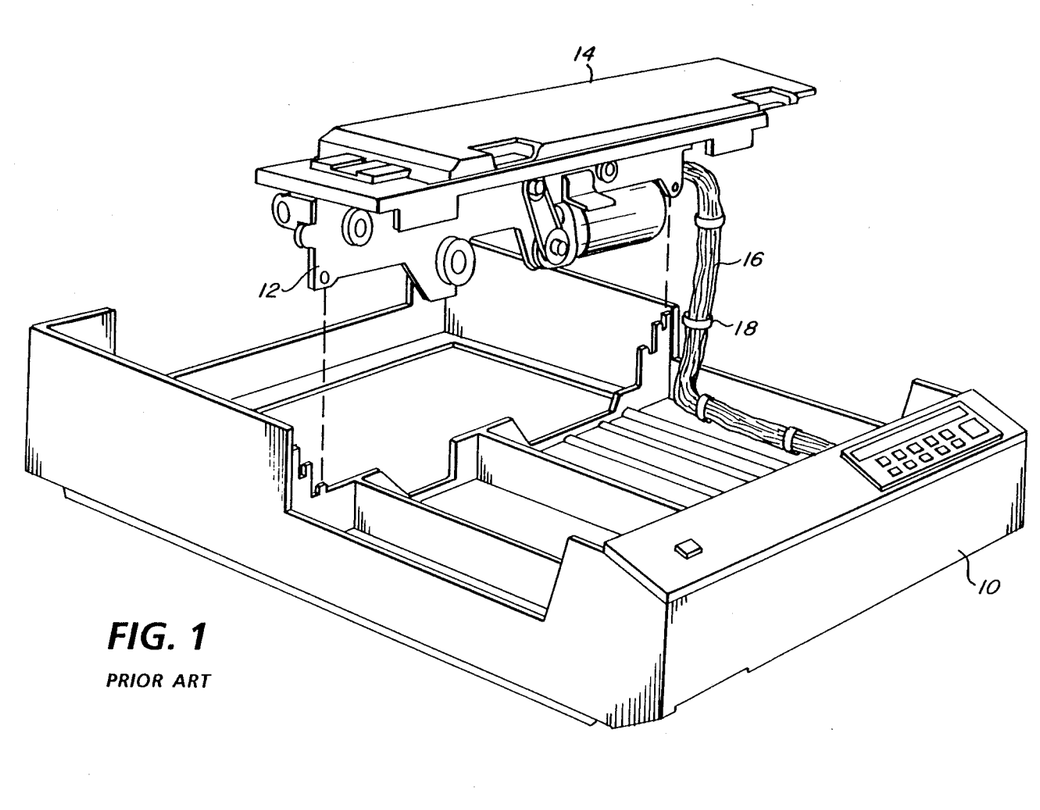
FIG. 1 is an isometric view partially exploded with a portion of the frame section of an electrostatographic reproducing apparatus with a representative illustration of a wiring harness conventionally employed.
Figure 2:
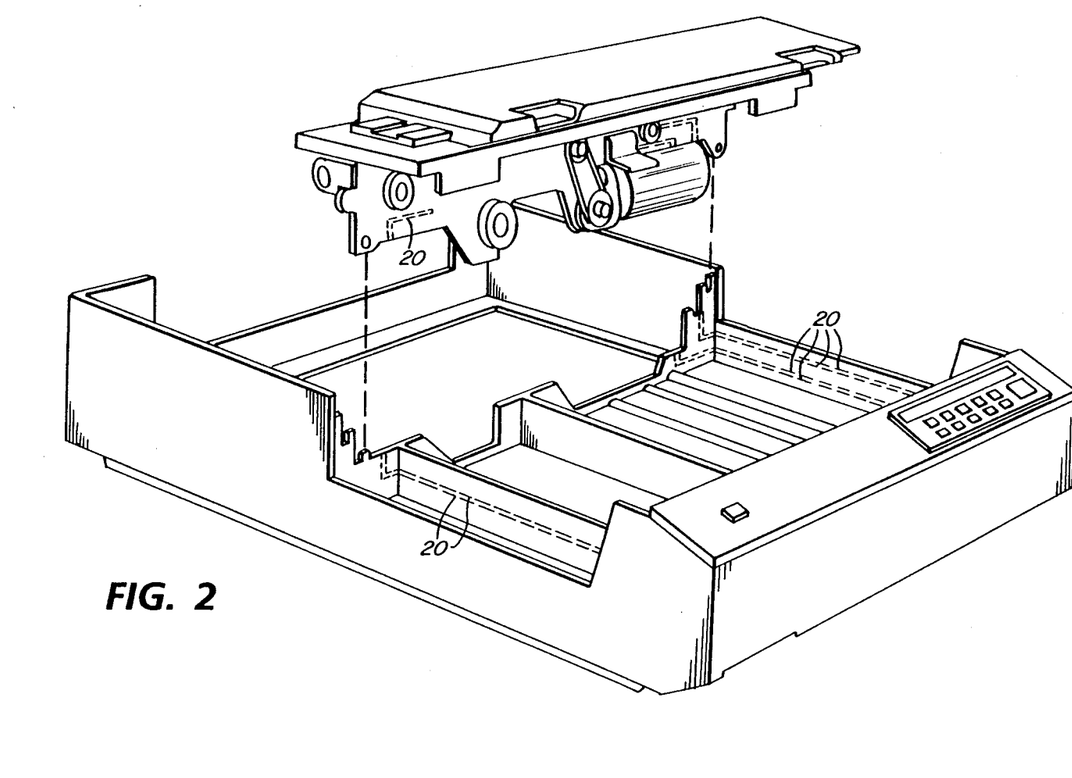
FIG. 2 is a view similar to that illustrated in FIG. 1 wherein the conventional wiring harness has at least in part been replaced by the in situ formed conductive paths according to the present invention.

Referring now to a comparison of FIGS. 1 and 2, the significance of the present invention will be immediately appreciated. In each of these figures only a structural frame 10 together with machine drive module 12, and platen drive module 14 are illustrated as parts of an electrostatographic reproducing apparatus. For a further description of the machine elements and its manner of operation, attention is directed to U.S. Pat. No. 4,563,078 to Fantuzzo et al. In FIG. 1, a conventional wiring harness is illustrated comprising a plurality of individual wires 16 held in the harness configuration by fasteners 18 which is here illustrated as a distributing power and/or logic signals from, for example, the control panel on frame 10 to the main machine drive 12. It will of course be understood that in a completed assembly, there will be a plurality of such wiring harnesses required which during assembly of the final product have to be manually placed in position and connected to the appropriate electrical components. By contrast, FIG. 2 illustrates an application of the present invention wherein electro-conductive paths or traces 20 may be formed directly in the machine support frame 10. These electro-conductive paths may be formed as the final step in the manufacture of the individual support frames 20 prior to the assembly of the whole machine and thereby avoid the necessity for manual placement and connection of the conventional wiring harness.

The electrically insulating polymer matrix may be formed from any suitable host polymer which is electrically insulating. The polymer may be selected from a wide range of commercially available materials which are suitable for molding or other shaping methods such as, for example, casting, extrustion, pultrusion and transfer molding. Polymers which are hydrophobic, exhibiting low moisture uptake are preferred due to their more stable volume resistivity at high relative humidity. Naturally, polymers which are non-toxic and have non-toxic thermal decomposition products are preferred. The polymer may for example be selected from a wide range of thermoplastic and thermosetting polymers as well as structural foams of these materials. Typical materials include polystyrene, polycarbonate, polyamides, polyesters, phenolics, epoxies, vinyl esters and the like. In addition, suitable elastomers such as for example silicones, urethanes, Hypalons, EPDMs and foams thereof may be used. When used as a structural member, it is naturally preferred to employ conventional engineering structural polymers. Typical of such thermoplastic polymers are the ABS resin acrylonitrile-butadiene-styrene copolymer which may be a blend produced from all three monomers or mixtures of copolymers or graft polymers such as styrene and acrylonitrile grafted on polybutadiene. In addition, other high temperature engineering plastics such as polysulfone, polyphenylene sulfide, polyether imides, poly(amide-imide) and fluoroplastics may be used. Further, low cost molding materials including polyphenylene oxides such as Noryl may be used.

The electrically insulating polymer may be loaded with any suitable polymeric fibrous material capable of heat conversion to conductive fibrous carbon within the polymer matrix. Typical of such fibrous filler are cellulose (rayon) and petroleum pitch based carbon fibers which are heat convertible carbonaceous fibers. A particularly preferred carbonaceous fiber of filler is thermally stabilized, polyacrylonitrile fibers which upon heat conversion provide electrically conducting fibers. These fibers are thermally stabilized by heating polyacrylonitrile fibers to temperatures of the order 300° C. in the presence of oxygen and usually under tension for a long period of time of up to twenty four hours wherein the polyacrylonitrile is changed from a white to black fiber while maintaining its electrically insulating characteristics. These thermally stabilized fibers also known as preox fibers can be made electrically conducting upon subsequent heat treatment to temperatures of the order of 2,000° C. in an inert atmosphere.

As used herein, the term electrically insulating is intended to define materials having a resistivity greater than about $10^{14}$ ohm centimeters and the term electrically conductive is intended to define materials having a resistivity less than about $10^9$ ohm centimeters. The degree of loading the polymer matrix with the fibers is such that upon the heat conversion of the fibers the converted fibers are in electrical contact providing an electrically conducting path in the polymer matrix. Typically, the fibers may be included in the polymer matrix in an amount of from about 5 to 70% by weight of the total filled polymer matrix. Preferably, however, from about 10 to 30% by weight of the polymer matrix is made up of the fibers. Since the cost of the fibers is substantially more than the cost of the polymer this range generally provides a good balance between cost and filler function in addition to providing the conducting path. At higher fiber loadings, greater reinforcement and strength is achieved in the composite. In addition, at lower fiber loadings there are fewer difficulties in dispersing the fiber in the polymer. If desired, the fibers can have an adhesion promoter such as polyvinyl alcohol, polyvinyl chloride or expoxy monomers coated thereon to enable the polymer in the fluid state when it is heated to readily adhere to the fibers. In addition, other additives such as fiber glass or flame retardents such as halogenated hydrocarbons may be added to the polymer matrix for additional reinforcement and flame retardency respectively. Typically, the fibers have a length much greater than the diameter with the length being from about 1 to about 12 millimeters and the diameter from about $5 \times 10^{-3}$ to about $5 \times 10^{-2}$ millimeters. It is important that the fibers be of sufficient length that upon pyrolysis they are capable of bridging the area from the pyrolyzed polymer matrix to the bulk of the unpyrolyzed polymer matrix to give durability to the final product. It is therefore important that the fibers maintain their fibrous nature during the compounding operation that result in a uniform dispersion of fibers throughout the polymer matrix. In addition to the fibers providing the conductive path following heat conversion, they also add structure to the host polymer acting to strengthen and stiffen it. In some applications compounding and molding techniques such as 2-shot molding, for example, that cause the fibers to preferentially move to the surface may be preferred.

The filled polymer matrix may be formed into an electrical component by conventional molding or extruding techniques. A particularly preferred technique is injection molding wherein three dimensional parts may be made in a very short time which do not require any post machining such as drilling or routing. If the electrical component is to be used as a support member such as the structural frame member or cover the polymer used should be one of the structural polymers mentioned above. Subsequent to the formation of the part, a portion of the polymer matrix corresponding to the desired conductive path is heated to a temperature sufficient to convert the electrically insulating fibrous filler to an electrically conductive fibrous filler thereby providing the electrically conductive path. The requisite heating may be carried out in any suitable manner which generates sufficient thermal excitation in the polymer matrix to convert the electrically insulating fibrous filler to an electrically conductive filler in the desired areas. While other techniques such as electron beam may be used, it is preferred to use a laser beam directed to a portion of the polymer matrix to pyrolyze the portion by melting the polymer and heat convertive the electrically insulating fibers to electrically conductive fibers to form the conductive path. A laser is a fast efficient tool and both continuous wave or pulsed laser may be employed which provide a narrow laser beam exposure of the polymer matrix in a predetermined pattern so that the convertible fibers will selectively absorb the radiation and heat convert preferentially becoming conductive over the host polymer. This is particularly effective with the black thermally stabilized polyacrylonitrile fibers which can more readily absorb the radiation. Any suitable laser may be employed it being required only that it impinge on the polymer matrix for a sufficient time and with sufficient power to raise the temperature of the fibrous filler to a temperature sufficient to render it electrically conducting. Both argon and carbon dioxide lasers are effective in this regard.

During the pyrolysis, the polymer matrix is heated locally and undergoes a thermal melting and decomposition with the hottest areas decomposing with the potential for some volatile decomposition products cooling upon contact with and then condensing on adjacent areas. There is some molten plastic flow in a narrow area and a narrow groove or trough may be observed in the exposed areas. During the pyrolysis, the fibers are converted to electrically conducting fibers and may be observed in the groove or trough with the heat converted conductive portion of the fiber in the trough and the remaining insulating portion in the unpyrolyzed polymer matrix. As discussed previously, it is important that the fiber fill density be sufficient to insure a plurality of contact points between fibers to produce a continuous conductive fiber path. The exposure or heat conversion is preferably carried out in an oxygen free atmosphere since oxygen tends to impede achieving high conductivity by converting carbon to carbon dioxide gas. The polymer/fiber composition has to be capable of absorbing the laser energy and the product of the absorption must be the necessary rise in temperature to melt or vaporize the polymer and heat convert the fibers. In other word, the fiber filled polymer matrix must absorb light at the writing or marking wavelength of the laser and result in the necessary rise in temperature.

For example, a test plaque made of ABS resin with 30% by weight of heat stabilized chopped preox polyacylonitrile fibers when exposed to a 200 watt peak power industrial $CO_2$ laser used at 20 watts and pulsed unfocused at 200 to 300 pulses/sec, while scanning at about 1.4 inches/sec produced a visible groove forming a conductive trace in the plaque having a D.C. volume resistivity of about 20 ohm-cm. This level of conductivity is sufficient for some purposes such as for example in situations where a high series impedance can be tolerated such as a sensor, for example, or in forming a pattern for subsequent electroplating the trace. We prefer to provide a conductive trace when used as a circuit having a resistivity as low as possible and less than about $10^{-2}$ ohm-cm.

The conductive paths may be individually created by directing a single laser beam for each path. If it is desired to create a plurality of conductive paths in a single piece part, a programmable bed or robot may be coupled in unison with the laser. The motion of the robot would align and carry the part under the laser at a predetermined scan rate. Upon completion of the formation of one conductive path, the laser can be shut off, the part indexed and realigned and the laser re-energized and the bed proceed to once again transport the part under the laser. This procedure, however, has the disadvantage of being relatively inefficient and time consuming and accordingly, if a plurality of conductive paths is desired to be formed in the piece part, the piece part can be masked with a mask having a predetermined conductive path pattern and thereafter randomly and/or continuously exposed to the laser thereby pyrolyzing only that portion of the substrate through the pattern in the mask. Typically such a mask is made from a material which is known to reflect the energy of the laser used. For example, a copper mask could be used to reflect the energy of the carbon dioxide laser without effect upon the copper. This procedure has the advantage in that the pattern size, shape and number of conductive paths are controlled by the mask and not by the programmable bed. Accordingly, higher line densities, better line resolution as well as improved pattern repeatability are achievable. Furthermore, process efficiency can be enhanced with the use of wide laser beams to pyrolyze many traces by a single pass of the part under the laser.

While the above described process is effective in producing paths that are sufficiently conducting to support a current flow or voltage, there may be situations in which metallic conductivity is desired on particular parts or particular portions thereof. Accordingly, conventional electroless or electroplating techniques and materials may be used to provide metallic conductivity to the conductive paths. Typical metals that may be employed include copper, nickel, gold, silver, tin, lead and platinum. Metallic plating also has the advantage in that it insures reliability of the mechanical interconnects between piece parts. In the plating process the conductive fibers are not only sites for plating but also promote adhesion of the plating to the substrates. In this process the groove formed also helps mechanical bonding.

According to the present invention, the laser beam is moved relative to the piece in which it is desired to create a conductive path or a pattern of conductive paths. This may be readily accomplished by holding the laser beam or the work piece stationary while the other is moved relative to the stationary item or by simultaneously moving both the laser and work piece in a controlled programmed manner. By controlling the relative motion of the laser beam relative to the piece, conductive paths or patterns of conductive paths may be readily created in three-dimensional objects or shapes as well as to two-dimensional surfaces.

Figure 3:
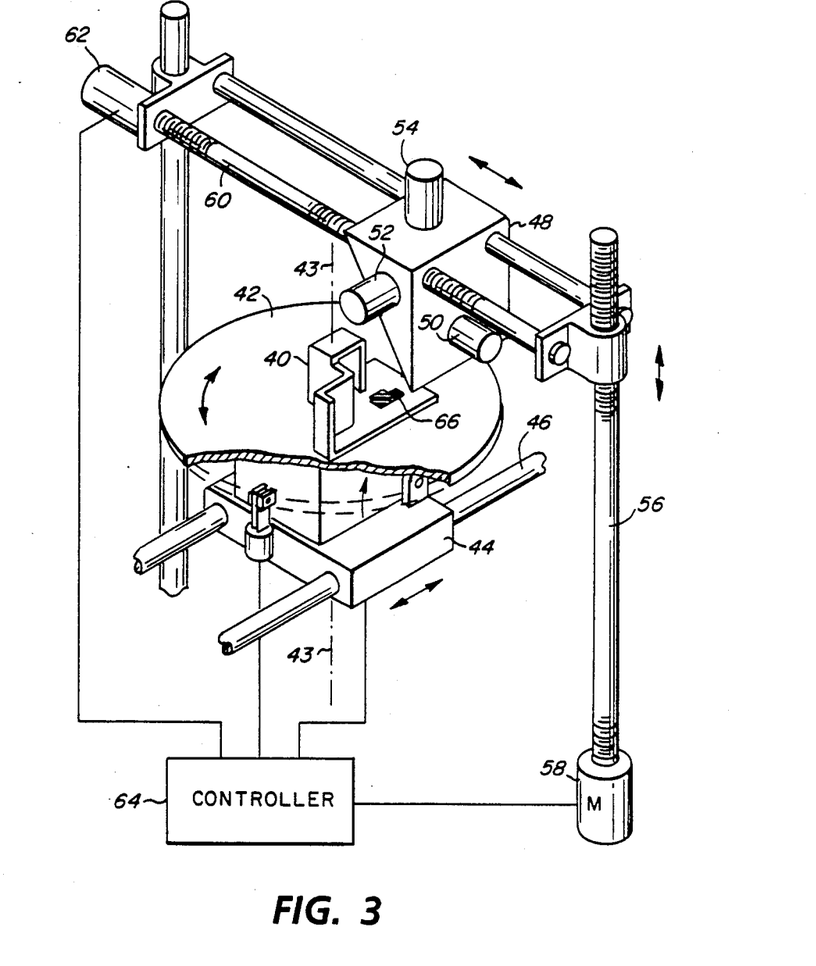
FIG. 3 is schematic illustration of a system for forming the electrically conductive traces in a structural member.

Attention is directed to FIG. 3 which schematically illustrates a manner in which a plurality of conductive paths representing circuit patterns can be prepared in a part.

The part 40 is secured to table 42 which is rotatably mounted about the center axis 43 or a motor shaft (not shown) in the motor box 44. In addition, the table is movable in the XY plane by movement of worm gear 46 by another motor (not shown) in the motor box 44. The laser scanning carriage 48 has three lasers 50, 52, 54, one directed in each direction with the carriage movable vertically by worm gear 56 and motor 58 and horizontally by worm gear 60 and motor 62. The movement of the table 42 and the scanning carriage 48 is controlled by a programmable controller 64 to form the preselected pattern of conductive traces in the part 40. If desired, a mask 66 having a predetermined pattern maybe placed over at least a portion of the part so that the part may be continuously exposed to the laser. If desired the entire assembly may be placed in an inert atmosphere or a vacuum chamber. Alternatively or in addition an exhaust hose may be placed adjacent the part being marked to remove any noxious materials produced by pyrolysis.

It will be appreciataed that FIG. 3 is merely representative of one manner and device that may be used to form the pattern of conductive traces and that other apparatus and techniques can be used. For example, the laser may be stationary and used with rotating or translating mirrors programmed to cause the beam to scan the part in one, two or three directions.

Accordingly, in fabricating a machine such as electrostatographic reproducing apparatus having a plurality of electrical components, the techniques described above can be used to provide the necessary circuit in situ in the individual piece parts as frames, covers, support members, etc. so that upon assembly of the final product, the individual piece parts can be put in their proper position and the use of individual wires and wiring harnesses substantially minimized if not eliminated. The electrical contacts between the conductive paths on the individual piece parts may be made with those conventional techniques available to the printed circuit board industry. Particularly, effective techniques include the use of the creation of electrically conductive lands or pads as part of the circuit proper in the individual piece parts which are placed in contact as a result of their final positioning in the main machine thereby completing the circuits.

Figure 4A:
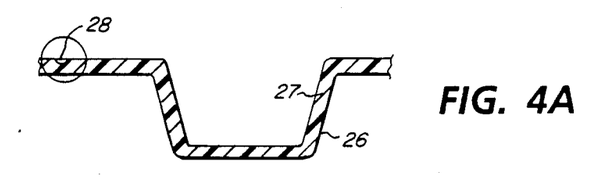
FIGS. 4A and 4B are cross-sectional views of a three-dimensional structural member having one electrically conductive path formed therein.
Figure 4B:
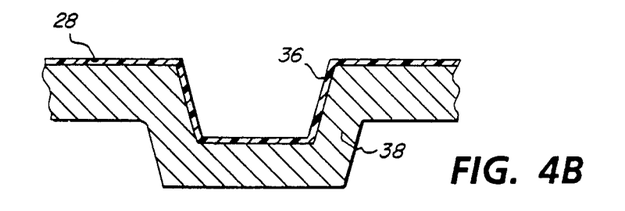
Figure 5A:
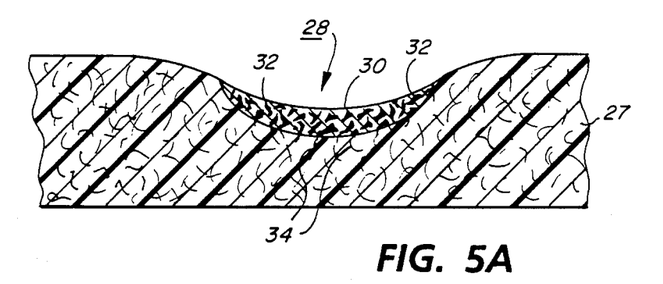
FIGS. 5A and 5B are enlarged views of the electrically conductive paths in FIG. 4.

Referring now to FIGS. 4A, 4B and 5A and 5B, in FIG. 4A a structural component 26 such as a subchassis may be made from an insulating structural polymer matrix 27 filled with heat convertible fibers which has a conductive path 28 formed therein. Alternatively, the polymer matrix may be present as an adherent coating 36 on a support member 38 as illustrated in FIG. 4B. The enlarged view of FIG. 5A illustrates a groove 30 formed in the polymer matrix by melting and some decomposition of the polymer locally in response to exposure to the laser beam. The troughs or grooves so formed may be of the order of 0.1 to 5.0 millimeters wide and from about 0.2 to 2.0 millimeters deep. Contained within the trough are conductive fibers 32 which have been heat converted by exposure to the laser beam. As previously discussed preferably this exposure or conversion takes place in an oxygen-free atmosphere. While the portion 32 of the individual fibers in the trough has been heat converted it should be noted that a portion 34 of the individual fibers extending into the polymer matrix has not been heat converted and serves to anchor the fibers in place in the polymer matrix.

Figure 5B:
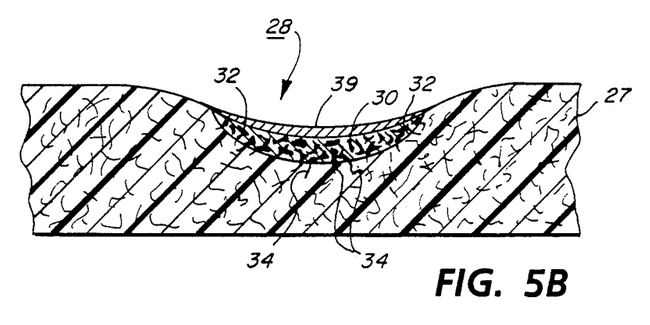

Alternatively, as seen in FIG. 5B the groove 30 may have an adherent metallic layer 39 plated thereon by conventional techniques to achieve metallic conductivity.

EXAMPLES 1-7

A carbon dioxide laser with a beam focused to a 200 micron spot having an output power of 1.8 watts was used to produce traces in a series of 2"×2" injection molded test plaques made of polyphenylene oxide, General Electric Noryl resin, with 20% by weight of the total weight being heat stabilized preox polyacrylonitrile fibers chopped to lengths of about 6 mm with diameters of about 10 microns. The test plaques were placed on a programmable sample table in a vacuum chamber with a transparent window for passages of the continuous wave laser beam and the following traces were made while argon flowed continuously over the samples in the chamber at a pressure of 6 Torr.

| Example Trace | Power | Scan Rate mm/sec | Scans | Trace Width Inches |
|---|---|---|---|---|
| 1 | 1.8 W | .3 | 1 | 0.044–0.060 |
| 2 | 1.8 W | .3 | 2 | 0.060–0.064 |
| 3 | 1.8 W | .6 | 1 | 0.056–0.060 |
| 4 | 1.8 W | .6 | 2 | 0.060–0.064 |
| 5 | 1.8 W | 1.0 | 2 | 0.036–0.040 |
| 6 | 1.8 W | 2.0 | 2 | 0.028–0.032 |
| 7 | 1.8 W | 3.0 | 2 | 0.024–0.028 |

The number of scans is the number of replicate scans in the same trace to try to achieve better uniformity. The resistivity for all traces was determined to be about 0.8 ohm cm.

EXAMPLE 8

The plaque of Example 4 was placed in a commercial gold electroplating solution (Orotemps—24, a neutral gold plating solution available from Technic Inc., Providence, R.I., with 2.4 volts current limited to 1 to 5 milliamps/centimeter for 8 to 12 minutes after which it was removed from the bath rinsed in deionized water and dried. Visual observation confirmed that gold had been electroplated in the trace area. The DC resistance was determined to be near zero with a conventional multimeter.

EXAMPLE 9

Ten parts by weight of the composition which the plaques are made of in Examples 1-7 was mixed with 90 parts of weight of toluence and milled in a roll mill for 48 hours to dissolve the polymer. The resulting despersion was applied with a brush to the surface of a test plaque of unfilled Noryl molded structural foam in a thickness of about 1 mil. Following drying of the coated plaque it was exposed to the laser beam in the manner of Examples 1-7 with a conductive trace being formed. The trace carried into the substrate and the resultant conductive path was formed by the fibers originally in the coating residing eventually in the substrate.

EXAMPLE 10

A carbon dioxide laser with a beam focused to a 200 micron spot having an output power of 3 watts was used to produce a trace in a 2"×2" injection molded test plaque made from General Electric Ultem resin, polyetherimide, filled with 20% by weight of the total weight of heat stabilized preox polyacrylonitrile fibers chopped to a length of about 6 mm with a diameter of about 10 microns. The plaque was placed on a programmable sample table in a vacuum chamber with argon continuously flowing over the sample at a pressure of 8 Torr while a trace was made in the plaque with a single scan of the laser at a scan rate of 1 mm/sec. A conductive trace about 0.2 cm wide and 0.4 cm deep with a resistivity of about $2.1 \times 10^{-3}$ ohm cm was produced.

EXAMPLE 11

The procedure of Example 10 was repeated except that the plaque was made from General Electric Noryl resin, polyphenylene oxide, filled with 20% by weight of the total weight of the same heat stabilized preox polyacrylonitrile fibers and the scanning rate was 2 mm/sec. A trace having about the same geometry and a resistivity of about $7.4 \times 10^{-3}$ ohms cm was obtained.

Accordingly, the present invention provides an economical alternative to conventional wiring and wire harness construction. It has the advantage of being able to integrate electrical or mechanical functions in the same piece part while at the same time facilitating automated manufacture of individual piece parts and automated assembly of such parts in a machine configuration. By integrating machine and component circuitry into mechanical or structural members, substantial cost savings may be achieved in manufacturing and assembly labor, inventory costs in that individual wires, pins, connectors, etc. can be eliminated. For example, a typical conventional wiring harness of say 70 wires and connectors can be reduced to but a single part. Furthermore, since the parts are subject to automated manufacturing techniques, substantial reduction in manufacturing and assembly error as a result of human involvement may be avoided. In addition, since the technique according to the present invention is capable of automated mass production, substantial cost savings may be passed on to the ultimate consumer.

The disclosures of the patents and other references referred to herein are hereby specifically and totally incorporated herein by reference.

While the invention has been described with reference to specific embodiments, it will be apparent to those skilled in the art that many alternatives, modifications and variations may be made. For example, while the invention has been generally illustrated with the conductive trace formed in the surface layer it will be appreciated that the surface layer may be substantially coated or the layer in which the conductive path is formed may be sandwiched between two other layers and be exposed to the laser beam through one of the layers which transmits light of the wiring wavelenth. Furthermore, while the invention has been described with specific reference to electrostatographic copier and printer machines, it will be appreciated it has application to a large array of machines with electrical components. Accordingly, it is intended to embrace all such alternatives and modifications as may fall with the spirit and scope of the appended claims.

We claim:

1. An electrical component comprising an electrically insulating polymer matrix filled with an electrically insulating fibrous filler capable of heat conversion to an electrically conducting fibrous filler, said electrically insulating polymer matrix including at least one continuous electrically conductive path formed by the in situ heat conversion of said electrically insulating fibrous filler.

2. The electrical component of claim 1 wherein said polymer matrix is present as an adherent surface layer on a base support member.

3. The electrical component of claim 1 wherein said insulating fibrous filler is heat convertible, carbonaceous fibers and said electrically conductive path comprises in situ heat converted carbonaceous fibers.

4. The electrical component of claim 3 wherein said heat convertible carbonaceous fibers are thermally stabilized polyacrylonitrile fibers and said conductive path comprises in situ heat converted thermally stabilized polyacrylonitrile fibers.

5. The electrical component of claim 1 wherein said polymer matrix is from about 5 to about 70% by weight fibrous filler.

6. The electrical component of claim 5 wherein said polymer matrix is from about 10 to about 30% by weight fibrous filler.

7. The electrical component of claim 1 wherein said insulating polymer matrix has a resistivity greater than about $10^{14}$ ohm cm and said electrically conductive path has a resistivity less than about $10^9$ ohm cm.

8. The electrical component of claim 1 wherein said at least one electrically conductive path comprises a narrow groove formed by laser pyrolysis of a portion of said filled insulating polymer matrix to melt said polymer and to convert said electrically insulating fibrous fillers electrically conductive fibers.

9. The electrical component of claim 8 wherein said narrow groove has an adherent continuous coating of a conductive metal plated thereon.

10. The electrical component of claim 8 wherein said at least one electrically conductive path comprises a plurality of conductive paths.

11. The electrical component of claim 10 wherein said component is three dimensional in shape and said at least one conductive path is three dimensional in shape.

12. The electrical component of claim 8 wherein said at least one groove is from about 0.2 to about 2.0 mm deep and from about 0.1 to about 5.0 mm wide.

13. The electrical component of claim 8 wherein adjacent said heat converted fibers are held by said polymer matrix in said groove and said fibers are in electrical contact providing an electrically conductive path in said groove.

14. The electrical component of claim 13 wherein said heat converted fibers are from about 1 to about 12 mm in length and from about $5\times10^{-3}$ to about $5\times10^{-2}$ mm in diameter.

15. A method of forming at least one electrically conductive path in a polymer matrix comprising providing an electrically insulating structural polymer matrix filled with electrically insulating fibrous filler capable of heat conversion to an electrically conducting fibrous filler, heating the portion of said polymer matrix corresponding to a desired conductive path to a temperature sufficient to convert said electrically insulating fibrous filler to an electrically conductive fibrous filler thereby providing said at least one electrically conductive path.

16. The method of claim 15 wherein said polymer matrix is a structural polymer matrix.

17. The method of claim 15 wherein said polymer matrix is present as an adherent surface layer on a base support member.

18. The method of claim 15 wherein said insulating fibrous filler is heat convertible carbonaceous fibers and said electrically conductive path comprises in situ heat converted carbonaceous fibers.

19. The method of claim 18 wherein said heat convertible carbonaceous fibers are thermally stabilized polyacrylonitrile fibers and said conductive path comprises in situ heat converted thermally stabilized polyacrylonitrile fibers.

20. The method of claim 19 wherein said polymer matrix is from about 5 to about 70% by weight fibrous filler.

21. The method of claim 15 wherein said polymer matrix is from about 10 to about 30% by weight fibrous filler.

22. The method of claim 21 wherein said insulating polymer matrix has a resistivity greater than about $10^{14}$ ohm cm and said electrically conductive path has a resistivity less than $10^9$ ohm cm.

23. The method of claim 15 wherein said heating comprises directing a laser beam to a portion of said polymer matrix to pyrolyze a portion of said filled insulating polymer matrix to melt said polymer and carbonize said electrically insulating fibers to electrically conductive fibers.

24. The method of claim 23 wherein said laser pyrolysis of said polymer matrix produces a narrow groove in said polymer matrix filled with heat converted conductive fibers held by said polymer matrix, said fibers being in electrical contact providing an electrical conductive path in said groove.

25. The method of claim 24 including the step of applying an adherent continuous coating of a conductive metal to said narrow groove.

26. The method of claim 23 wherein said laser beam is directed to said polymer matrix in a predetermined pattern.

27. The method of claim 26 wherein said laser beam is directed toward said polymer matrix through a mask having a predetermined pattern.

28. The method of claim 27 wherein said predetermined pattern comprises a plurality of paths.

29. The method of claim 23 wherein said polymer matrix is a three dimensional member and including the step of moving said support member and said laser beam relative to each other to create at least one electrically conductive path which is three dimensional in profile.

30. The method of claim 24 wherein said narrow groove is from about 0.2 to about 2.0 mm deep and from about 0.1 to about 5.0 mm wide and said converted conductive fibers are from about 1 to about 12 mm in length and from about $5\times10^{-3}$ to about $5\times10^{-2}$ mm in diameter.

31. A machine including a plurality of electrical components each requiring the supply of electrical current for proper functioning, said machine including at least one support member comprising an electrically insulating structural polymer matrix filled with an electrically insulating fibrous filler capable of heat conversion to an electrically conducting fibrous filler said electrically insulating structural polymer matrix including at least one continuous electrically conductive path between electrical components formed by the in situ head conversion of said electrically insulating fibrous filler.

32. The machine of claim 31 wherein said polymer matrix is present as an adherent surface layer on a base support member.

33. The machine of claim 31 wherein said support member is formed of said polymer matrix.

34. The machine of claim 31 wherein said support member is a structural machine member.

35. The machine of claim 31 wherein said support insulating fibrous filler is heat convertible carbonaceous fibers and said at least one electrically conductive path comprises in situ heat converted carbonaceous fibers.

36. The machine of claim 35 wherein said heat convertible carbonaceous fibers are thermally stabilized polyacrylonitrile fibers and said conductive path comprises in situ heat converted thermally stabilized polyacrylonitrile fibers.

37. The machine of claim 31 wherein said polymer matrix is from about 5 to about 70% by weight fibrous filler.

38. The machine of claim 31 wherein said at least one electrically conductive path comprises a narrow groove formed by laser pyrolysis of a portion of said filled insulating polymer matrix to melt said polymer and to convert said electrically insulating fibrous filler to electrically conductive fibers.

39. The machine of claim 38 wherein said narrow groove has an adherent continuous coating of a conductive metal plated thereon.

40. The machine of claim 38 wherein said at least one electrically conductive path comprises a plurality of conductive paths.

41. The machine of claim 40 wherein said support member is three dimensional in shape and said at least one electrically conductive path is three dimensional in shape.

42. The machine of claim 40 wherein said at least one groove is from about 0.2 to about 2.0 mm deep and from about 0.1 to about 0.1 to about 5.0 mm wide.

43. The machine of claim 38 wherein adjacent said heat converted fibers are held by said polymer matrix in said groove and said fibers are in electrical contact providing an electrically conductive path in said groove.

44. The machine of claim 43 wherein said heat converted fibers are from about 1 to about 12 mm in length and from about $5\times10^{-3}$ to about $5\times10^{-2}$ mm in diameter.

* * * * *